(12) United States Patent
Bratkovski et al.

(10) Patent No.: US 7,847,236 B2
(45) Date of Patent: Dec. 7, 2010

(54) FRESNEL ANTENNA

(75) Inventors: Alexandre M. Bratkovski, Mountain View, CA (US); R. Stanley Williams, Portola Valley, CA (US); Shih-Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 501 days.

(21) Appl. No.: 11/831,275

(22) Filed: Jul. 31, 2007

(65) Prior Publication Data

US 2009/0034050 A1    Feb. 5, 2009

(51) Int. Cl.
    *G01D 5/36* (2006.01)
(52) U.S. Cl. .................. 250/237 G; 250/216; 343/720; 359/884
(58) Field of Classification Search .......... 250/216, 250/237 G; 977/724, 832, 834; 343/720–721, 343/907, 909; 359/846–849, 884
See application file for complete search history.

(56) References Cited

U.S. PATENT DOCUMENTS

2008/0013878 A1* 1/2008 Fujiwara et al. ............... 385/12

OTHER PUBLICATIONS

Javier Alda, Jose M Rico-Garcia, Jose M Lopez-Alonzo and G Boreman, Optical Antennas for Nano-Photonic Applications, Mar. 4, 2005, Institute of Physics Publishing Ltd. 2005 Nanotechnology 16, S230-S234.*
Francisco Javier Gonzalez, Javier Alda, Bojan Ilic, and Glen Boreman, Infrared Antennas Coupled to Lithographic Fresnel Zone Plate Lenses, Nov. 20, 2004, Optical Society of America, Applied Optics vol. 43, No. 33, pp. 6067-6073.*
Lezec, H.J., et al., "Beaming Light from a Subwavelength Aperture", Science, vol. 297, Aug. 2, 2002, pp. 820-822.
Barnes, W.L., et al., "Surface plasmon subwavelength optics", Nature, Nature Publishing Group, vol. 424, Aug. 14, 2003, pp. 824-830.
Alda, J., et al., "Optical Antennas for Nano-Photonic Applications", Trends on Nanotechnology, Phantoms Foundations, Segovia, Spain, Sep. 13-17, 2004.
Alda, J., et al., "Micro- and Nano-Antennas for Light Detection", Egypt. J. Solids, vol. 28, No. 1, 2005, pp. 1-13.

* cited by examiner

*Primary Examiner*—Joseph Martinez
*Assistant Examiner*—James R Greece

(57) ABSTRACT

A Fresnel antenna includes a plurality of Fresnel elements spaced to selectively attenuate electromagnetic waves having a predetermined wavelength, selected wavelengths, or range of wavelengths, and to concentrate electromagnetic waves having a predetermined wavelength, selected wavelengths, or range of wavelengths other than the attenuated wavelengths.

25 Claims, 3 Drawing Sheets

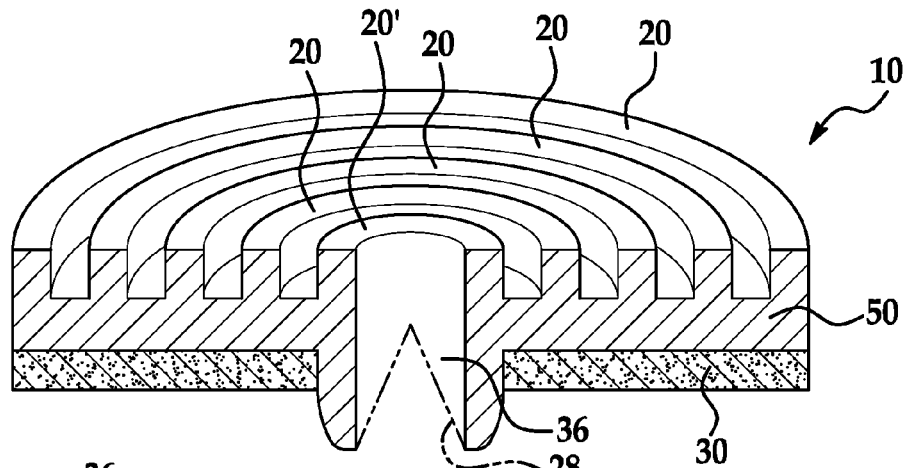
FIG. 1
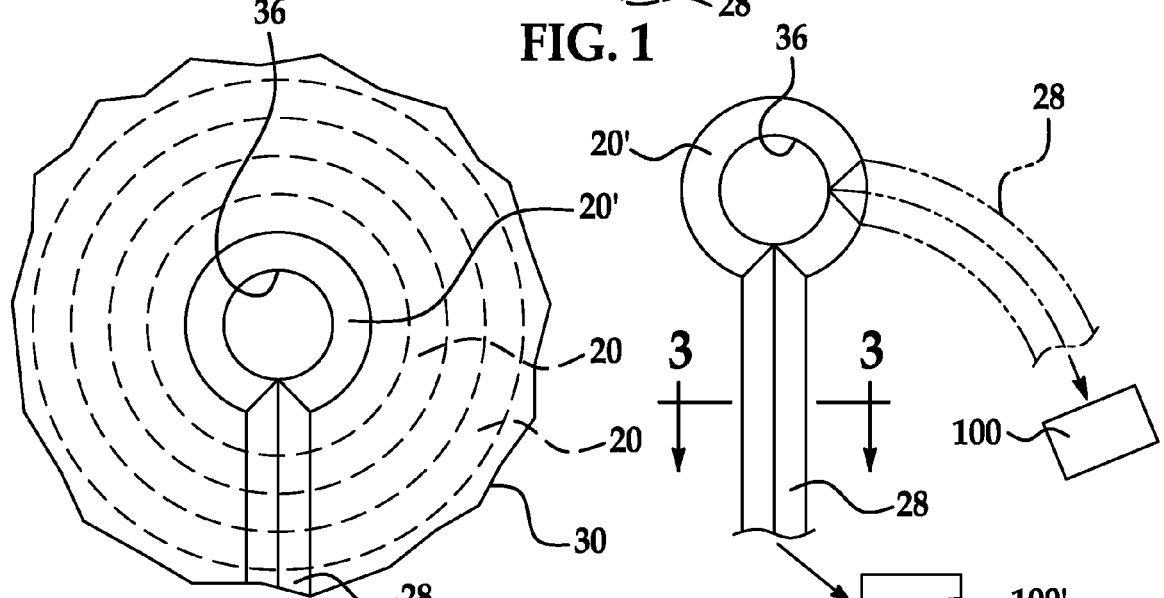
FIG. 2
FIG. 4
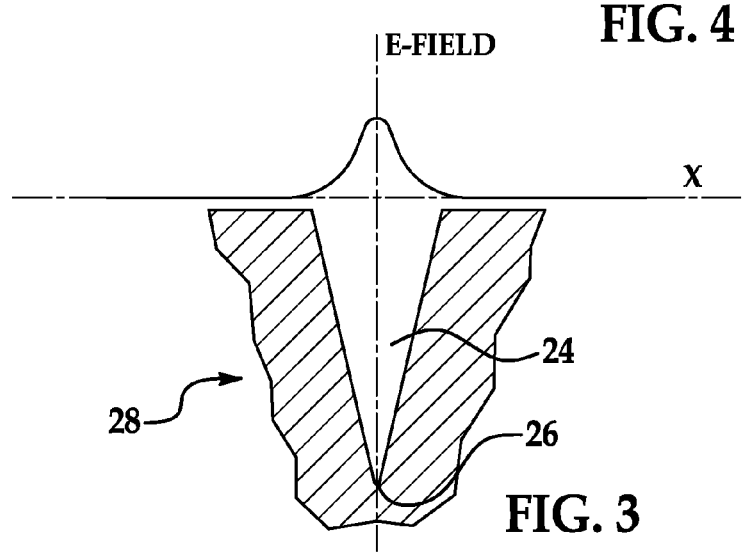
FIG. 3

FRESNEL ANTENNA

BACKGROUND

The present disclosure relates generally to Fresnel antennas.

Antennae for receiving light are important in electronic imaging and energy conversion. Electronic imaging involves converting electromagnetic waves to electrical signals, thereby allowing the image to be stored, analyzed, or reproduced electronically. Some current electronic imaging devices are used in, e.g., digital cameras, infrared cameras, microscopes, night vision goggles and document scanners. Energy conversion relates to solar power cells that convert light energy to electrical energy.

Fresnel lenses have been used in optics to capture light and direct it to photo detectors. Fresnel lenses, however, have had a lower limit on the size of the Fresnel elements because the spacing between the elements had to be large enough to interact with, and direct light waves to photo detectors.

Recent advances in subwavelength optics have been achieved using nanometer scale metal structures to convert light to surface plasmons. Periodic structures surrounding a subwavelength aperture on the entrance and exit side of the aperture have allowed the transmission of a well defined beam "through" the subwavelength aperture.

BRIEF DESCRIPTION OF THE DRAWINGS

Features and advantages of embodiments of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIG. 1 is cross-sectional perspective view of an embodiment of a Fresnel antenna;

FIG. 2 is a cut-away bottom view of the Fresnel antenna shown in FIG. 1;

FIG. 3 is a cross-sectional view taken along line 3-3 of FIG. 4 showing a plasmonic waveguide;

FIG. 4 is a semi-schematic bottom view of a Fresnel antenna operatively connected to a plasmon waveguide, and showing a second plasmon waveguide in phantom;

DETAILED DESCRIPTION

Figure 5:
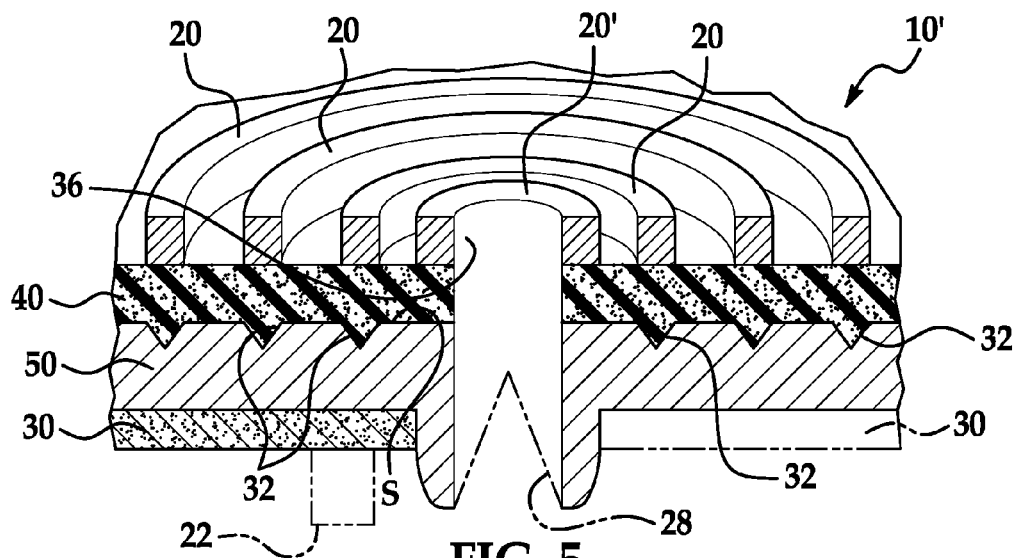
FIG. 5 is a cut-away, cross-sectional perspective view of another embodiment of a Fresnel antenna, including an electromagnetic wave amplifying layer and a metal plasmon collector layer.

The recent advances in subwavelength optics mentioned above were achieved with incident light filtered by a separate device to a narrow band. However, the application of nano scale Fresnel elements to create a wavelength selective, electromagnetic wave harvesting device has not previously been proposed. The present inventors have unexpectedly and fortuitously discovered that Fresnel structures may be used to filter and collect wavelengths from wideband incident light and selectively transmit the wavelength(s) of interest to subsequent photonic or electronic devices. As a result, it is contemplated as being within the purview of the present disclosure that nano scale Fresnel antennae may be used to create arrays in such devices as infra-red (IR), visible (vis) light, or ultra-violet (UV) imaging systems. They may further be used as elements in optical and photonic circuits, for example, connectors, narrow band filters, or the like.

Embodiments of the Fresnel antenna disclosed herein advantageously include Fresnel elements to selectively attenuate electromagnetic waves having a predetermined wavelength, selected wavelengths, or range of wavelengths, and to concentrate electromagnetic waves having a predetermined wavelength, selected wavelengths, or range of wavelengths other than the attenuated wavelengths. As such, the Fresnel antenna/e disclosed herein may generally act as a filter for select wavelengths.

It is to be understood that the terms "attenuate/attenuated/attenuating wavelength(s)" as used herein refers to wavelengths that are substantially filtered out of the electromagnetic waves impinging on the Fresnel antenna/e as disclosed herein. It is to be further understood that the terms "concentrate/concentrated/concentrating wavelength(s)" as used herein refers to wavelengths that are gathered or harvested by the Fresnel antenna/e as disclosed herein for subsequent use. Yet further, it is to be understood that the intensity of the concentrated wavelengths may increase near the central aperture of the Fresnel antenna/e.

In an embodiment, the Fresnel elements attenuate electromagnetic waves having wavelengths within a band including infra-red light, visible light, ultra-violet light, or combinations thereof. Without being bound to any theory, it is believed that the spacing of the Fresnel elements in the nano scale advantageously provides wavelength selectivity in the Fresnel antenna. Furthermore, the Fresnel antenna/e disclosed herein may be used in a variety of applications, including, but not limited to detecting and/or harvesting electromagnetic waves.

Referring now to FIG. 1, an embodiment of a Fresnel antenna 10 is depicted. The Fresnel antenna 10 includes a plurality of Fresnel elements 20, 20' spaced to selectively concentrate electromagnetic waves having a particular wavelength(s)/range of wavelengths, and to attenuate electromagnetic waves having a wavelength(s)/range of wavelengths other than the attenuated wavelength(s). It is to be understood that the particular wavelength(s)/range of wavelengths may include harmonics of the wavelength(s). In an embodiment, adjacent Fresnel elements 20, 20' are spaced from about 300 nm to about 850 nm apart. In an alternate embodiment, adjacent Fresnel elements 20, 20' are spaced from about 400 nm to about 600 nm apart. The elements 20, 20' are generally spaced apart a distance sufficient to capture the wavelength of interest, e.g., ranging from IR to UV. It is to be understood that the terms "spaced" and "spacing," when referring to adjacent Fresnel elements 20, 20', refer to the "crest to crest" distance between adjacent Fresnel elements 20, 20', i.e. from the center of a radial cross section of one Fresnel element 20, 20' to the center of a radial cross section of an adjacent Fresnel element 20, 20'.

Each Fresnel element 20, 20' may be integrally formed with, or may be formed on, a metal plasmon collector layer 50. Non-limiting examples of suitable metals for the layer 50 include Ag, Au, Al, Rh, Pt, Ni, Cu, etc. In this embodiment, each of the Fresnel elements 20, 20' is also formed of metal. It is to be understood that the metal used to form the Fresnel elements 20, 20' may be the same or different from the metal used to form the metal plasmon collector layer 50. Generally, in embodiments in which the Fresnel elements 20, 20' are formed integrally with the layer 50, the metals are the same. In embodiments in which the Fresnel elements 20, 20' are established on the layer 50, the metals may be the same or different. As such, any of the previously listed metals may be suitable for forming the Fresnel elements 20, 20'.

It is to be understood that, in some instances, the Fresnel elements 20, 20' may be formed from non-metal materials, e.g., heavily doped semiconductors. By "heavily," it is meant doping well over $10^{19}$ cm$^{-3}$, or delta-doped surfaces with doping in excess of $10^{20}$ cm$^{-3}$.

The metal layer 50 and/or the Fresnel elements 20, 20' may be formed via nanoimprint lithography, selective deposition processes, or via non-selective deposition and patterning processes. Examples of suitable deposition techniques include physical vapor deposition, non-limitative examples of which include sputter deposition or evaporation deposition (e.g., thermal or e-beam), chemical vapor deposition (CVD), atomic layer deposition (ALD), inkjet deposition, other suitable printing techniques, and/or spin-coating. In a selective deposition process, a mask or blocking layer may be used to coat any selected surfaces, in order to prevent deposition on such surfaces during deposition of the metal on the remaining unmasked surfaces. In a non-selective deposition process, the metal is deposited on all exposed surfaces. Those surfaces upon which the metal is desirable are then protected by a masking layer, and any remaining unprotected portions of the metal are subsequently removed. Generally, the masking layer is then removed from the protected surfaces, which remain covered with the metal.

In an embodiment, at least a portion of the metal plasmon collector layer 50 is established on a substrate layer 30. The substrate layer 30 may be formed of any suitable dielectric material. It is to be understood that the dielectric material may be an organic dielectric material, an inorganic dielectric material and/or a hybrid mixture of organic and inorganic dielectric materials. A non-limitative example of the organic dielectric material is poly(vinylphenol) (PVP), and non-limitative examples of the inorganic dielectric material are silicon nitride, silicon dioxide, and aluminum oxide (alumina).

As shown in FIG. 1, the metal plasmon collector layer 50 has a subwavelength aperture/plasmonic collector 36 located substantially at the center of the layer 50. The plasmonic collector 36 is electrically or electromagnetically connected to each of the Fresnel elements 20, 20', e.g., via the metal plasmon collector layer 50. As shown in FIG. 1, the Fresnel element 20' extends through the substrate 30 and substantially surrounds the plasmonic collector 36. In an example, metallic Fresnel elements 20, 20', a metallic plasmonic collector 36 and the metal plasmon collector layer 50 may respectively be electrically disconnected from each other, but may be electromagnetically connected, since each of these features supports plasmons.

It is to be understood that the subwavelength aperture/plasmonic collector 36 has an effective diameter or opening, which may be of any suitable shape and/or configuration. As non-limiting examples, the effective diameter may be substantially round, a slit, or the like. It is to be further understood that the effective diameter may be any suitable size, as desired, and is dependent upon the wavelength for which the antenna is tuned. In one embodiment, the effective diameter is smaller than one half the wavelength of the smallest of a plurality of concentrated electromagnetic wavelengths (where the wavelength is measured in free space, not when converted to plasmons) that is desired to be collected. In a non-limiting example, the aperture/plasmonic collector 36 has an effective diameter ranging from about 150 nm to about 425 nm, and the smallest electromagnetic wavelength to be collected ranges from about 300 nm to about 850 nm.

It is believed that coupling the free-space electromagnetic waves with plasmons allows the electromagnetic waves to be propagated in the form of plasmons, and to be converted back to electromagnetic waves at the aperture/plasmonic collector 36.

In the embodiment shown in FIG. 1, the Fresnel element 20' and the plasmonic collector 36 are electrically or electromagnetically connected to a plasmonic waveguide 28. When electromagnetic waves (e.g., light waves) impinge on the Fresnel elements 20, 20', predetermined wavelengths of light interact with the free electrons in the Fresnel elements 20, 20' to create plasmons. In an embodiment, the plasmons propagate from the respective Fresnel elements 20, through the metal plasmon collector layer 50, and to the plasmonic collector 36. The plasmons may then be radiated back into light, conducted by the plasmonic waveguide 28 for processing by logic elements (not shown), or combinations thereof.

Referring now to FIG. 2, a cut-away bottom view of the Fresnel antenna 10 of FIG. 1 is depicted. As shown and as previously described, the plasmonic waveguide 28 is electrically or electromagnetically connected to both the innermost Fresnel element 20' and the plasmonic collector 36. FIG. 3 illustrates a cross-sectional view of the plasmonic waveguide 28 of FIG. 4. As depicted in FIG. 3, the plasmonic waveguide 28 has a notch 24. FIG. 3 also illustrates that the E-field in the plasmonic waveguide 28 is generally strongest at the nadir 26 of the notch 24.

FIG. 4 illustrates multiple plasmonic waveguides 28 electrically or electromagnetically connected to the element 20' of a Fresnel antenna 10. As depicted, the plasmonic waveguide (s) 28 may be substantially straight, or may be curved as desired. Furthermore, the waveguides 28 may power various devices 100,100'. Such devices include, but are not limited to various electronics of an integrated circuit board. As shown in FIG. 4, the devices 100,100' may be operatively located adjacent an end of the waveguide 28, or at any suitable location. Although two waveguides 28 are shown, it is to be understood that any number of waveguides 28 may be used (within the limits of the particular size/geometry of the Fresnel element 20'), as desired.

Referring now to FIG. 5, another embodiment of the Fresnel antenna 10' is depicted. In this embodiment, the nano scale Fresnel elements 20, 20' are formed on/in contact with an electromagnetic wave amplifying layer 40. In an embodiment, the electromagnetic wave amplifying layer 40 is formed from direct gap semiconductor materials with a suitable size gap (e.g., group III-V semiconductor materials (e.g., GaAs, InP, etc.)), glass with erbium doping, or combinations thereof.

As depicted, the electromagnetic wave amplifying layer 40 is established on/in contact with the metal plasmon collector layer 50. As such, in this embodiment, the metal plasmon collector layer 50 is spaced from the Fresnel elements 20, 20'. The metal plasmon collector layer 50 may have plasmon collecting grooves or notches 32 formed in a surface S of the metal plasmon collector layer 50 that is adjacent the electromagnetic wave amplifying layer 40. In one embodiment, each notch 32 is formed such that it is substantially aligned with a respective Fresnel element 20, 20' (as shown in FIG. 5). Such alignment aids in substantially preventing scattering.

The electromagnetic wave amplifying layer 40 may be formed via any of the methods previously described herein for the metal layer 50 and/or for the Fresnel elements 20, 20'. In an embodiment, for a communication wavelength where λ=1.55 μm, the electromagnetic wave amplifying layer 40 may be tailored from an InP/InGaAsP quantum well, via overgrowth of metal on top of it. In a further embodiment, for light within a visible wavelength, the electromagnetic wave amplifying layer 40 may be tailored from a GaAs/AlGaAs quantum well, via overgrowth of metal on top of it. In yet a further embodiment, for light within the blue wavelength, the electromagnetic wave amplifying layer 40 may be tailored from a GaN/AlN quantum well, via overgrowth of metal on top of it. The metal overgrown in each case above may be silver (Ag); however, it is to be understood that any suitable metal may be used, e.g., Au, Al, Rh, Pt, Ni, Cu, etc.

The metal plasmon collector layer 50 may also be established on a dielectric substrate layer 30. In an embodiment, the dielectric substrate layer 30 electrically insulates the metal plasmon collector layer 50 from any potentially undesirable sources or sinks for electrons. However, it is also to be understood that in any of the embodiments disclosed herein, all or a portion of the substrate layer 30 may be removed, for example, via a selective etching process (as shown on the right hand side of FIG. 5). In one embodiment, the dielectric substrate layer 30 may be removed via reactive ion etching. As such, the substrate layer 30 is present in some embodiments of the antenna 10, 10' and is removed in other embodiments.

The dielectric substrate layer 30 may be established by any suitable technique, including, but not limited to plasma enhanced chemical vapor deposition (PECVD), atomic layer deposition (ALD), low temperature chemical vapor deposition, physical vapor deposition sputtering, physical vapor deposition evaporation, and spin on glass.

It is to be understood that in any of the embodiments disclosed herein, the substrate layer 30 may be a flexible substrate. As shown in FIG. 5, a flexible substrate 30 may be operatively connected to a MEMS (microelectromechanical system) driver 22. The MEMS driver 22 may provide controllable flexibility of the substrate layer 30. In an embodiment, the MEMS driver 22 is configured to selectively flex the substrate layer 30, which in turn, selectively changes the spacing between the Fresnel elements 20, 20'. It is believed that selectively changing the spacing between the elements 20, 20' also changes the wavelengths that are attenuated or concentrated in a desired manner. As such, it is further believed that the flexible substrate layer 30 (with or without the MEMS driver 22) enables wavelength selectivity of the Fresnel antenna 10,10' to be adjusted or tuned as desired by any suitable means.

In the embodiment shown in FIG. 5, electromagnetic waves, such as light, having predetermined wavelength(s)/range(s) of wavelengths impinging on the Fresnel elements 20, 20' are transmitted by the Fresnel elements 20, 20' to the electromagnetic wave amplifying layer 40. In a non-limitative example, a group III-V semiconductor is used as the electromagnetic wave amplifying layer 40. The group III-V semiconductor is electrically pumped and amplifies the light waves, thereby transferring the light waves to the metal plasmon collector layer 50, where the amplified light waves couple with plasmons. In an embodiment, the semiconductor wave amplifying layer 40 includes one or more quantum wells in a heterojunction p-i-n configuration (similar to 1550 nm wavelength semiconductor laser active layers). Electrical contacts are made to the p and n layers, and forward biased to generate gain in the quantum well active layer/semiconductor wave amplifying layer 40.

The plasmonic collector 36 propagates the plasmons to the center of the antenna 10', where they are converted to light, conducted by the plasmonic waveguide 28 for processing by logic elements (not shown), or combinations thereof.

In another non-limitative example, glass with erbium doping is used as the electromagnetic wave amplifying layer 40. Light from a laser, diode, or other light source may be used to pump the erbium doped glass amplifying layer 40. In an embodiment, a 980 nm pump wavelength may be pumped from the sides (e.g., edge coupled), or from the top or from the bottom. The layer 40 amplifies the light waves, thereby transferring them to the metal plasmon collector layer 50 where the amplified light waves couple with plasmons. As previously described, the plasmonic collector 36 propagates the plasmons to the center of the antenna 10', where they are converted to light, conducted by the plasmonic waveguide 28 for processing by logic elements (not shown), or combinations thereof.

Figure 6:
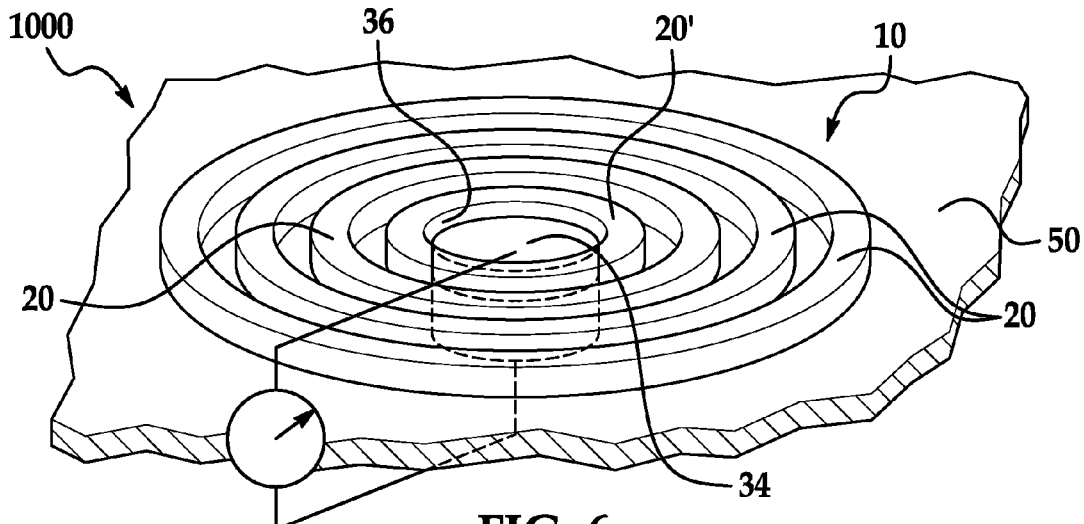
FIG. 6 is a cut-away perspective view of an embodiment of an electromagnetic wave detector system.

Referring now to FIG. 6, an embodiment of an electromagnetic wave detector system 1000 is depicted. The system 1000 includes an embodiment of the Fresnel antenna 10, 10' (antenna 10' is not shown in this Figure), and an electromagnetic wave detector 34 established in/in contact with the subwavelength aperture/plasmonic collector 36.

As a non-limiting example, the electromagnetic wave detector 34 is a photo detector, such as a PIN photodiode or an avalanche photodetector.

The Fresnel elements 20, 20' of the antenna 10, 10' are arranged substantially concentrically about the aperture 36. As previously described, the Fresnel elements 20, 20' are spaced so as to selectively attenuate electromagnetic waves having a predetermined wavelength, selected wavelengths, or range of wavelengths, and to concentrate electromagnetic waves having a predetermined wavelength, selected wavelengths, or range of wavelengths other than the attenuated wavelengths. The concentrated wavelengths/range of wavelengths are concentrated to the aperture/plasmonic collector 36 where the electromagnetic wave detector 34 is configured to detect the concentrated electromagnetic waves.

Figure 7:
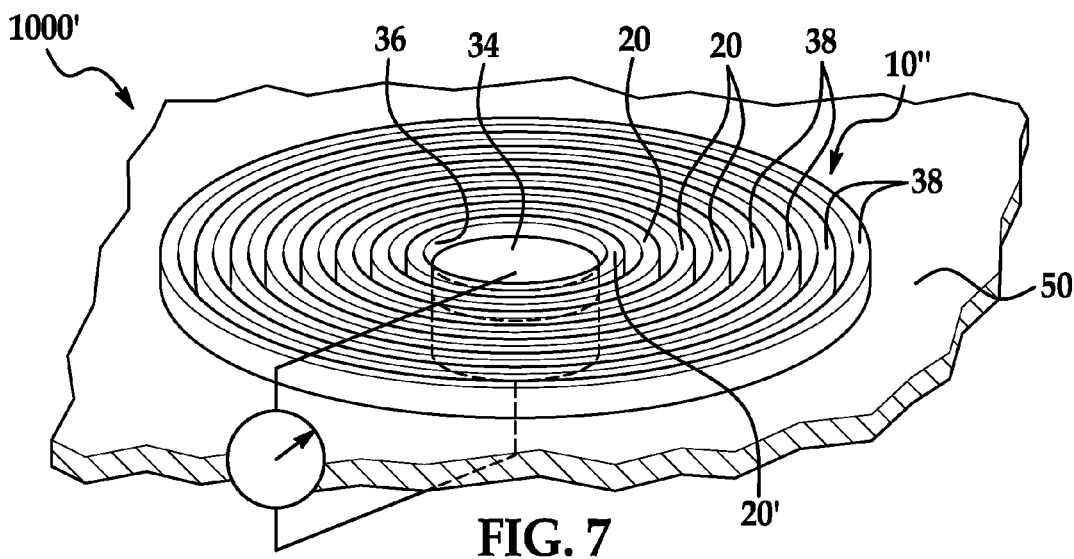
FIG. 7 is a cut-away perspective view of another embodiment of electromagnetic wave detector system including semiconductor Fresnel elements surrounding metallic Fresnel elements.

Still another embodiment of the system 1000' is depicted in FIG. 7. This embodiment of the system 1000' includes still another embodiment of the Fresnel antenna 10". In this embodiment of the antenna 10", semiconductor Fresnel elements 38 are spaced radially from and surround the metallic Fresnel elements 20, 20'. It is to be understood that the other layers 30, 40, 50 and plasmonic collector 36 of the antennae 10, 10' disclosed in reference to FIGS. 1 and 5 may be included in the embodiment of the antenna 10" shown in FIG. 7. It is believed that the semiconductor Fresnel elements 38 amplify the impinging electromagnetic waves. In an embodiment, each semiconductor Fresnel element 38 has a diameter that is larger than the largest concentrated electromagnetic wavelength. One or more of the semiconductor Fresnel elements 38 may include one or more electromagnetic wave detector(s) 34, e.g., a PIN diode structure, integrated therewith.

In any of the embodiments herein, it is to be understood that the size of the wave detector 34 may be any suitable size sufficient to effectively pick up most or all of the radiation through the aperture 36. In an embodiment, the wave detector 34 is substantially larger than the aperture 36. The electromagnetic wave detector 34, e.g., the PIN diode structure is configured to allow the semiconductor elements 38 to be electrically pumped to amplify the concentrated electromagnetic waves. In an embodiment, the electromagnetic wave detector 34, e.g., a photodiode, may be connected in parallel, similar to nanowire photodiodes that consist of many nanowires connected in parallel, where each acts as a photodiode.

Figure 8:
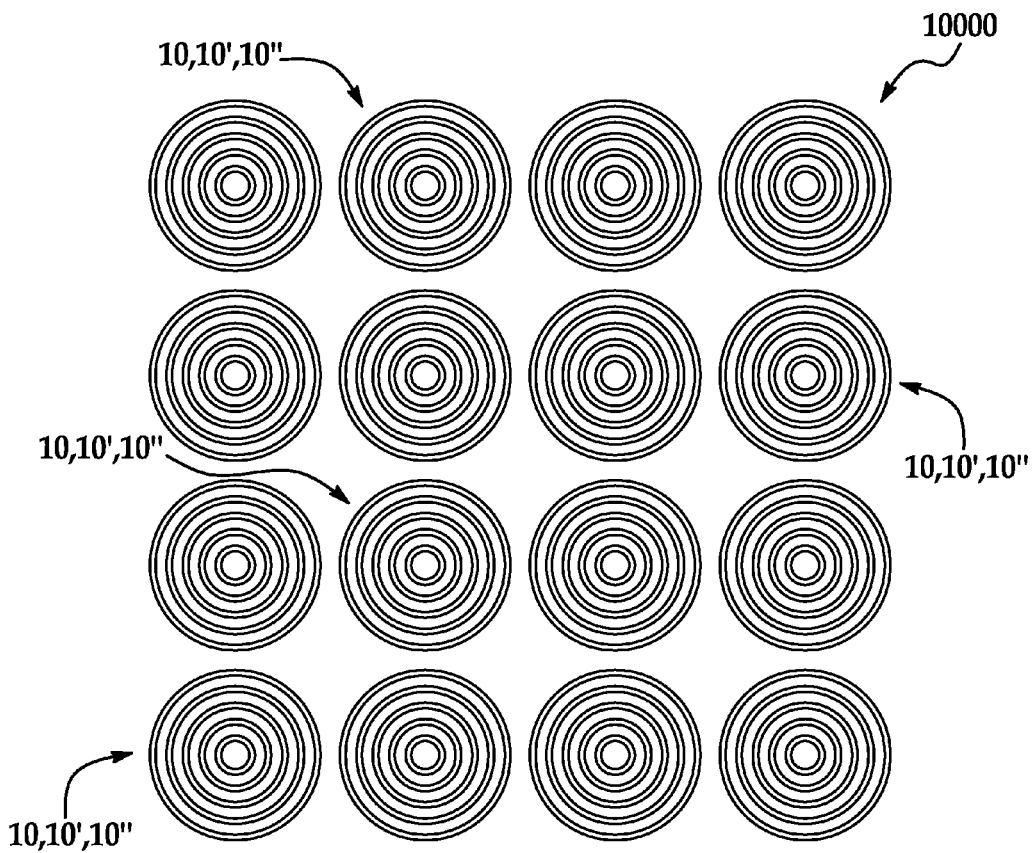
FIG. 8 is a semi-schematic top view of a two-dimensional array of Fresnel antennae.
Figure 9:
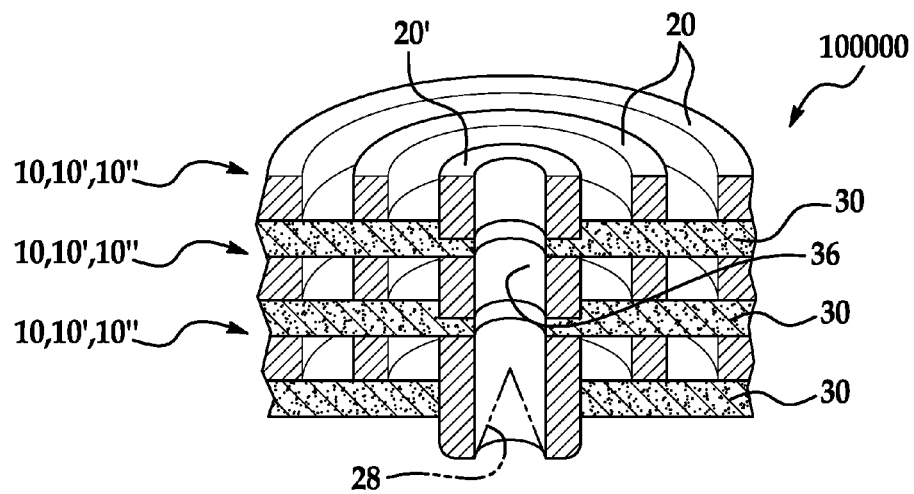
FIG. 9 is a cut-away, cross-sectional perspective view of an embodiment of a stack of Fresnel antennae.

It is to be understood that there may be any number of the Fresnel antennae 10, 10', 10" disclosed herein; and further, that such antennae 10, 10', 10" may be arranged in a two dimensional array 10,000 (see FIG. 8), a stack 100,000 (see FIG. 9), or in a stack 100,000 of two dimensional arrays 10,000. When the Fresnel antennae 10, 10', 10" are arranged in a stack 100,000, the concentrated electromagnetic waves output from one antenna 10, 10', 10" are impinged upon another antenna 10, 10', 10" for selection of wavelengths, amplification, attenuation, or other manipulation of the electromagnetic waves. It is believed that including the Fresnel antennae 10, 10', 10" in a stack 100,000 advantageously increases the gain.

A single Fresnel antenna 10, 10', 10" is generally tuned to one wavelength λ and higher harmonics (e.g., λ/n, where n=2, 3,4 . . .). If it is desirable to collect more than one wavelength, a two dimensional array 10,000 may be used, with the array 10,000 including two or more "different" Fresnel antennae 10, 10', 10", each patch tuned for a specific λ of interest. Adjacent antennae 10, 10', 10" in an array may be spaced apart (i.e., crest to crest from an outermost Fresnel element 20 of one antenna 10,10', 10" to an outermost Fresnel element 20 of an adjacent antenna 10, 10', 10") any suitable distance as desired. Generally, this spacing is similar to spacing between adjacent Fresnel elements 20, 20' within a single antenna 10,10', 10", as described above.

In an embodiment of the method for harvesting electromagnetic signals, a plurality of Fresnel elements 20, 20' (including, in an embodiment, semiconductor Fresnel elements 38), spaced to selectively attenuate electromagnetic waves having a predetermined wavelength, selected wavelengths, or range of wavelengths, and to concentrate electromagnetic waves having a predetermined wavelength, selected wavelengths, or range of wavelengths other than the attenuated wavelengths, is provided. A plasmonic collector 36 is electrically or electromagnetically connected to the Fresnel elements 20, 20', 38, and a plasmonic waveguide 28 is electrically or electromagnetically connected to the plasmonic collector 36. Amplified electromagnetic waves are coupled with plasmonic waves in the plurality of Fresnel elements 20, 20', 38; and the plasmonic waves from the plasmonic waveguide 28 may be used as harvested electromagnetic signals.

In another embodiment of the method for harvesting electromagnetic signals, a two-dimensional array 10,000 of antennae 10, 10',10" is provided. In this embodiment, each antenna 10,10' includes metallic Fresnel elements 20, 20'. At least one of the antennae 10" also includes a plurality of semiconductor Fresnel elements 38 spaced radially from the metallic Fresnel elements 20, 20'. The concentrated electromagnetic waves are amplified via the semiconductor Fresnel elements 38 in the antenna 10".

The amplified electromagnetic waves may then be coupled with plasmonic waves in the metallic Fresnel elements 20, 20' of another antenna 10,10', 10" that is different from, or the same as the antenna 10" in which the electromagnetic waves are amplified. In this embodiment, a plasmonic collector 36 is electrically or electromagnetically coupled to the Fresnel elements 20, 20', and a plasmonic waveguide 28 is electrically or electromagnetically coupled to the plasmonic collector 36 in the other antenna 10, 10', 10". It is to be understood that the geometry of the connection (as well as of any of the connections mentioned herein) is desirably substantially without sharp changes in cross section and/or without other disruptions. The plasmonic waves from the plasmonic waveguides may be used as the harvested electromagnetic signals.

While several embodiments have been described in detail, it will be apparent to those skilled in the art that the disclosed embodiments may be modified. Therefore, the foregoing description is to be considered exemplary rather than limiting.

What is claimed is:

1. A Fresnel antenna, comprising:
a plurality of Fresnel elements spaced to selectively attenuate electromagnetic waves having a predetermined wavelength, selected wavelengths, or range of wavelengths, and to concentrate electromagnetic waves having a predetermined wavelength, or selected wavelengths other than the attenuated wavelengths.

2. The Fresnel antenna as defined in claim 1, wherein the concentrated electromagnetic waves have wavelengths within a band including infra-red light, visible light, ultraviolet light, or combinations thereof.

3. The Fresnel antenna as defined in claim 1, wherein adjacent elements of the plurality of Fresnel elements are spaced from about 300 nm to about 850nm apart.

4. An electromagnetic wave detector system, comprising:
an electromagnetic wave detector; and
the Fresnel antenna as defined in claim 1 operatively connected to the electromagnetic wave detector.

5. The electromagnetic wave detector system as defined in claim 4 wherein the electromagnetic wave detector is a photo detector.

6. An electromagnetic wave detector system, comprising:
an electromagnetic wave detector; and
a Fresnel antenna operatively connected to the electromagnetic wave detector, the Fresnel antenna including:
a plurality of Fresnel elements spaced to selectively attenuate electromagnetic waves having a predetermined wavelength, selected wavelengths, or range of wavelengths, and to concentrate electromagnetic waves having a predetermined wavelength, selected wavelengths, or range of wavelengths other than the attenuated wavelengths;
wherein the electromagnetic wave detector is a PIN photodiode or an avalanche photodetector.

7. The electromagnetic wave detector system as defined in claim 4, further comprising at least one additional Fresnel antenna, wherein the Fresnel antennae are operatively disposed in a stack.

8. The Fresnel antenna as defined in claim 1, further comprising:
an electromagnetic wave amplifying layer disposed in contact with the plurality of Fresnel elements; and
a metal plasmon collector layer disposed in contact with the electromagnetic wave amplifying layer and spaced from the Fresnel elements by the electromagnetic wave amplifying layer.

9. The Fresnel antenna as defined in claim 8, further comprising a dielectric substrate in contact with the metal plasmon collector layer.

10. The Fresnel antenna as defined in claim 8, wherein the electromagnetic wave amplifying layer is formed from Group III-V semiconductors, glass with erbium doping, or combinations thereof.

11. The Fresnel antenna as defined in claim 8 wherein the metal plasmon collector layer has a metallic surface contacting the wave amplifying layer, and includes plasmon collecting notches formed in the metallic surface, wherein each of the notches is substantially aligned with a respective adjacent Fresnel element.

12. A Fresnel antenna, comprising:
a plurality of Fresnel elements spaced to selectively attenuate electromagnetic waves having a predetermined wavelength, selected wavelengths, or range of wavelengths, and to concentrate electromagnetic waves having a predetermined wavelength, selected wavelengths, or range of wavelengths other than the attenuated wavelengths;
a flexible substrate operatively connected to the Fresnel elements; and
a MEMS driver operatively connected to the flexible substrate, wherein the MEMS driver is configured to selectively flex the substrate, thereby selectively adjusting the spacing between the Fresnel elements;
wherein the antenna is selectively tuned.

13. A Fresnel antenna, comprising:
a plurality of Fresnel elements spaced to selectively attenuate electromagnetic waves having a predetermined wavelength, selected wavelengths, or range of wavelengths, and to concentrate electromagnetic waves having a predetermined wavelength, selected wavelengths, or range of wavelengths other than the attenuated wavelengths;
a plasmonic collector electrically or electromagnetically connected to the Fresnel elements, wherein the Fresnel elements are formed from metal; and
at least one plasmonic waveguide electrically or electromagnetically connected to the plasmonic collector.

14. The Fresnel antenna as defined in claim 13 wherein there is a plurality of concentrated electromagnetic wavelengths, with one wavelength that is smallest, wherein the plasmonic collector is an aperture substantially centered within the Fresnel elements, and wherein the aperture has an effective diameter smaller than one half of the smallest concentrated electromagnetic wavelength.

15. The Fresnel antenna as defined in claim 13 wherein there is a plurality of concentrated electromagnetic wavelengths, with one wavelength that is largest, and wherein the antenna further comprises:
a plurality of semiconductor Fresnel elements spaced radially from the metallic Fresnel elements wherein each of the semiconductor Fresnel elements has a diameter larger than the largest concentrated electromagnetic wavelength; and
at least one PIN diode structure integrated with at least one of the plurality of semiconductor Fresnel elements, the at least one PIN diode structure configured to allow the semiconductor Fresnel elements to be electrically pumped to amplify the concentrated electromagnetic waves.

16. A two-dimensional array of the Fresnel antennae as defined in claim 1.

17. A method for harvesting electromagnetic signals, comprising:
providing a plurality of Fresnel elements spaced to selectively attenuate electromagnetic waves having a predetermined wavelength, selected wavelengths, or range of wavelengths, and to concentrate electromagnetic waves having a predetermined wavelength, selected wavelengths, or range of wavelengths other than the attenuated wavelengths;
coupling the amplified electromagnetic waves with plasmonic waves in the plurality of Fresnel elements;
electrically or electromagnetically connecting a plasmonic collector to the Fresnel elements;
electrically or electromagnetically connecting a plasmonic waveguide to the plasmonic collector; and
using plasmonic waves from the plasmonic waveguide as harvested electromagnetic signals.

18. The method as defined in claim 17, further comprising operatively stacking layers of the plurality of Fresnel elements, thereby increasing gain.

19. The method as defined in claim 17, further comprising:
operatively disposing the plurality of Fresnel elements on a flexible substrate; and
selectively adjusting spacing between adjacent Fresnel elements by flexing the substrate, thereby providing a tunable Fresnel antenna.

20. The method as defined in claim 19, further comprising:
operatively connecting at least one MEMS driver to the flexible substrate; and
tuning the spacing by flexing the substrate with the MEMS driver.

21. The method as defined in claim 17 wherein the Fresnel elements are metallic, and wherein the method further comprises:
disposing a plurality of semiconductor Fresnel elements spaced radially from the metallic Fresnel elements; and
amplifying the concentrated electromagnetic waves via the semiconductor Fresnel elements.

22. The method as defined in claim 21, further comprising:
operatively disposing the plurality of metallic Fresnel elements and semiconductor Fresnel elements on a flexible substrate; and
selectively adjusting spacing between adjacent metallic Fresnel elements and between adjacent semiconductor Fresnel elements by flexing the substrate, thereby providing a tunable Fresnel antenna.

23. The method as defined in claim 21 wherein there are at least two layers, each of the at least two layers including the plurality of metallic Fresnel elements and the plurality of semiconductor Fresnel elements, and wherein the method further comprises increasing gain by operatively stacking the at least two layers.

24. A method for harvesting electromagnetic signals, comprising:
providing a two-dimensional array of antenna cells, each antenna cell including a plurality of metallic Fresnel elements spaced to selectively attenuate electromagnetic waves having a predetermined wavelength, selected wavelengths, or range of wavelengths, and to concentrate electromagnetic waves having a predetermined wavelength, selected wavelengths, or range of wavelengths other than the attenuated wavelengths;
disposing a plurality of semiconductor Fresnel elements spaced radially from the metallic Fresnel elements in at least one cell;
amplifying the concentrated electromagnetic waves via the semiconductor Fresnel elements in the at least one cell;
coupling the amplified electromagnetic waves with plasmonic waves in the metallic Fresnel elements in at least one other cell that is the different from, or the same as the at least one cell;
electrically or electromagnetically connecting a plasmonic collector to the metallic Fresnel elements in the at least one other cell;
electrically or electromagnetically connecting a plasmonic waveguide to the plasmonic collector in the at least one other cell; and using plasmonic waves from the plasmonic waveguides as the harvested electromagnetic signals.

25. A Fresnel antenna, comprising:

a plurality of Fresnel elements spaced to selectively attenuate electromagnetic waves having a predetermined wavelength, selected wavelengths, or range of wavelengths, and to concentrate electromagnetic waves having a predetermined wavelength, selected wavelengths, or range of wavelengths other than the attenuated wavelengths;

wherein the concentrated electromagnetic waves have wavelengths within a band including ultra-violet light.

* * * * *